United States Patent
Hoffman (10) Patent No.: US 9,906,117 B1
(45) Date of Patent: Feb. 27, 2018

(54) SYSTEMS, METHODS, AND DEVICES FOR REMOTE SENSE WITHOUT WIRES

(71) Applicant: Versatile Power, Inc., Campbell, CA (US)

(72) Inventor: David Hoffman, Santa Cruz, CA (US)

(73) Assignee: Versatile Power, Inc., Campbell, CA (US)

( * ) Notice: Subject to any disclaimer, the term of this patent is extended or adjusted under 35 U.S.C. 154(b) by 0 days.

(21) Appl. No.: 15/469,069

(22) Filed: Mar. 24, 2017

(51) Int. Cl.
*H02M 1/08* (2006.01)
*H02M 1/00* (2006.01)

(52) U.S. Cl.
CPC ............... *H02M 1/00* (2013.01); *H02M 1/08* (2013.01); *H02M 2001/0006* (2013.01)

(58) Field of Classification Search
CPC ............ H02M 1/00; H02M 1/08; H02M 1/32; H02M 1/36; H02M 2001/0006; H02M 2001/0009; H02M 2011/0016
See application file for complete search history.

(56) References Cited

U.S. PATENT DOCUMENTS

| | | | | |
|---|---|---|---|---|
| 8,369,056 B2* | 2/2013 | Senriuchi | ............... | H02J 7/0031 361/93.1 |
| 8,525,490 B2* | 9/2013 | Itoi | ........................... | H02P 9/48 322/28 |
| 8,687,326 B2* | 4/2014 | Dong | ...................... | H02M 1/32 361/18 |
| 2011/0285361 A1* | 11/2011 | Kihara | ...................... | H02P 9/48 322/28 |
| 2017/0205458 A1* | 7/2017 | Kurooka | .................. | G01D 5/12 |

* cited by examiner

*Primary Examiner* — Matthew Nguyen
(74) *Attorney, Agent, or Firm* — Terrence J. Edwards; TechLaw Ventures, PLLC (57) ABSTRACT

A system for controlling power output of a power supply includes power conversion circuitry, output terminals, and a controller. The controller controls the power conversion circuitry to provide a known current to one or more leads, wherein the one or more leads are shorted at the distal end. The controller measures a voltage drop across the one or more leads shorted at the distal end. The controller stores a parameter determined based on the voltage drop, such as a resistance of the one or more leads. The controller controls the power conversion circuitry to provide a target voltage to the load based on the stored parameter when the one or more leads are not shorted at the load.

20 Claims, 5 Drawing Sheets

SYSTEMS, METHODS, AND DEVICES FOR REMOTE SENSE WITHOUT WIRES

TECHNICAL FIELD

The present disclosure relates to power supplies and more particularly relates to enabling a power supply to correct for voltage drops in wires between the power supply and a load.

DETAILED DESCRIPTION

Remote sense, a common feature on test and measurement power supplies, allows a system or user to correct for voltage drop in the wires between the power supply and the load. This is an important feature as it can help assure that the voltage desired at the load actually gets to the load. Without remote sense the output of the power supply (such as the output terminals of the power supply) may be accurate, but the voltage that reaches the load may be less due to drops in voltage that occur in the distribution wiring.

Figure 1:
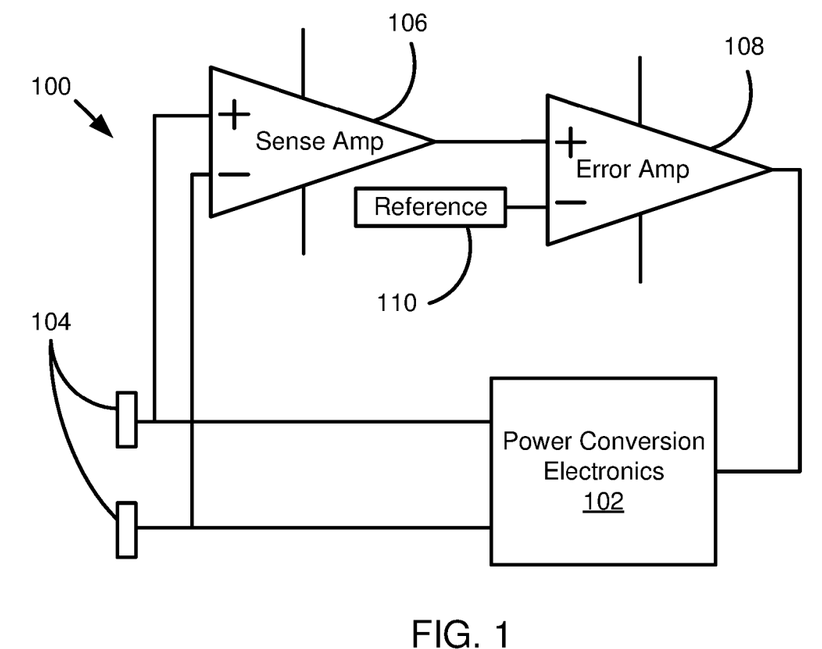
FIG. 1 is a schematic diagram illustrating a power supply.

Typically, a power supply will sense the output at a point very close to the output terminals and cause the voltage at that sense point to be accurately regulated. FIG. 1 illustrates a typical sensing circuit arrangement that may be used in a bench power supply 100 without remote sense capability. The power supply 100 includes power conversion electronics 102 for converting an electrical input (not shown) into an electrical output to the output terminals 104. For example, wire leads may be connected to the output terminals 104 to provide power to a load. A sense amplifier 106 measures the output near the output terminals 104 and an error amplifier 108 detects an error between the actual output and a reference 110 output. The power conversion electronics 102 correct the output based on the output of the error amplifier 108 to provide the desired output level. In this example, the sense amplifier 106 only senses the output at the output terminals 104 of the power supply.

Figure 2:
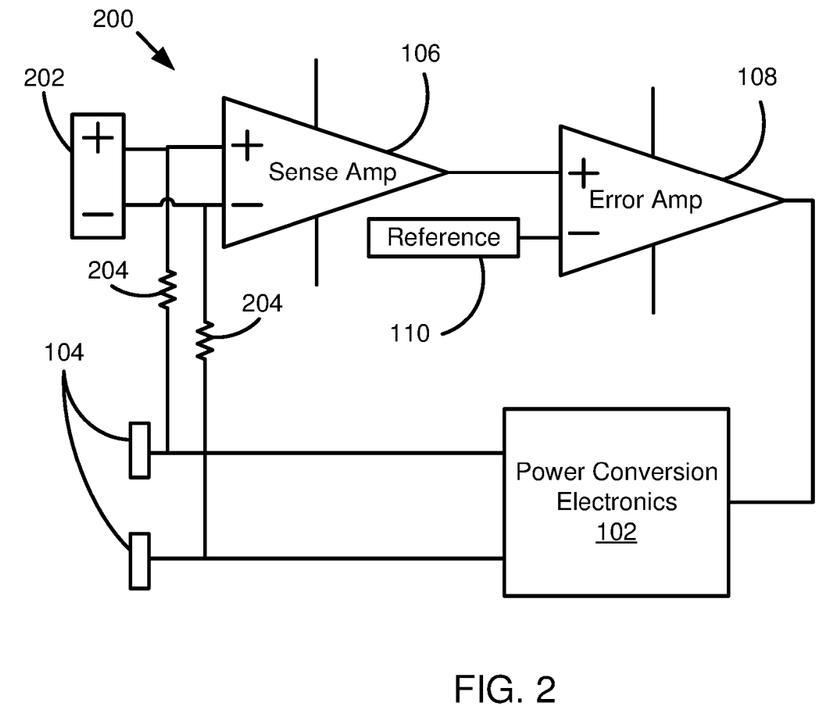
FIG. 2 is a schematic diagram illustrating a power supply with a remote sense connector.

A power supply 200 with basic remote sense is illustrated in FIG. 2. The power supply 200 includes an additional remote sense connector 202 that allows a user to connect a pair of wires originating out at a load and then terminating right at or near the sense amplifier 106. Small value resistors 204 are added in series with the sense lines that go directly to the output near the output terminals 104 of the power supply. These resistors 204 allow the remote sense signal from the remote sense connector 202 to override the signal from the output terminals 104 so long as the resistance in the sense wires that are connected to the remote sense connector 202 is significantly less than the series resistors 204. If no remote sense wires are attached to the remote sense connector 202, the resistors 204 connect the sense amplifier 106 to the output terminals 104.

While the remote sense technique of FIG. 2 is widely used, it has some serious drawbacks that limit its performance. In addition, there are failure mechanisms associated with this topology that frequently occur.

Specifically, a first drawback and failure point results from noise. With a basic remote sense scheme, such as that in FIG. 2, a user is required to run a second set of leads, in addition to the power cables or leads, to the load. A common problem with the sense leads is that they are long and prone to picking up noise from the environment. As the sense leads end up going to the sense amplifier 106, which is used as feedback for controlling the power supply 200, any noise picked up by the sense leads will be amplified by the power supply 200 and will show up as much more noise on the output. This may result in a noisy output with unwanted oscillations of output provided by the power supply 200 or even failure of the power supply 200.

Thus, significant care must be taken with sense leads to avoid noise sources. Frequently, even the output leads that are connected to the output terminals 104 of the power supply 200 itself must be avoided to eliminate problems. For this reason, small value resistors 204 are usually used between the remote sense connector 202 and the output terminals 104. If large value resistors are used, the input impedance of the remote sense would be so high that the noise problem would be insurmountable. Unfortunately, the resistors cannot be made so small that there is no noise problem due to ground loop issues, which are discussed further below. Applicant has recognized that power supplies with existing remote sense systems have had ongoing issues including power supply failures that result from injected noise issues.

In addition to noise, another serious issue with basic remote sense schemes is the possibility of ground loops. Any power supply, and particularly high-current power supplies, can create a significant voltage drop in the wires or leads connecting the output of the power supply to the load. This is a reason remote sensing is used. Unfortunately, should the leads to the load be undersized or become accidentally disconnected, damage to the power supply internal remote sense circuit can result. This occurs because any drop across the load wires is reflected across the two series resistors that are necessary in the sense circuit. Should either load wire momentarily open, or should the drop in the load wires be sufficient, the sense resistors will conduct enough current to cause them to fail. This is a frequent cause for return in many power supplies.

In light of the foregoing, Applicants have developed systems, methods, and devices for remote sense without wires. In one embodiment, a power supply system includes power conversion circuitry for providing electrical power to a load and output terminals, which output power from the power conversion circuitry. The system also includes a controller for controlling output of electrical power from the power conversion circuitry. The controller is configured to receive a signal to trigger calibration. The controller controls the power conversion circuitry to provide a known current to one or more leads for connecting the power conversion circuitry to the load at a distal end, wherein the one or more leads are shorted at the distal end. The controller measures a voltage drop across the one or more leads shorted at the distal end. The controller stores a parameter determined based on the voltage drop. The parameter may include one or more of the voltage drop and an impedance of the one or more leads calculated based on the voltage drop and the known current. The controller controls the power conversion circuitry to provide a target voltage to the load based on the stored parameter when the one or more leads are not shorted at the load.

Many test and measurement power supplies are designed with analog control loops. Some may have digital front panels and digital interfaces for the user, but the actual control of the power supplies is still done with analog circuits. In one embodiment, a power supply system includes a controller designed with full digital control. Digital control may allow the controller to do things that are not possible with an analog control loop. For example, the controller can change the control loop in real time to accommodate many types of loads. The performance of the power supply can also be tailored to meet the needs of a particular load or user.

In the case of remote sense, digital control may be used to eliminate the noise and ground loop problems discussed above, as well as provide add additional benefits. In one embodiment, no leads are required other than the power leads to the load. This eliminates the cost and effort of adding extra noise sensitive wires to the system without losing accuracy in the voltage or power level provided to a load. It also allows for the elimination of resistors between output terminals and a sense amplifier (e.g., see FIG. 2). This can be accomplished by sensing the load current and determining the resistance of the leads to the load. Once the load current and resistance of leads to the load are known, then Ohms law can be used to determine the voltage needed on the output of the power supply to get the proper voltage on the load. In a digitally controlled power supply, the output current can be detected and the output voltage requirement can be calculated at the switching frequency of the power supply. In at least one embodiment, wireless remote sensing embodiments disclosed herein can respond to variations in the load current faster than a wired remote sense scheme can.

Setup may include a calibration process or mode to determine a resistance of the leads that will be used to provide power to the load. To do this, a user may connect the load to the power supply through any chosen wires. Next, the user shorts the power supply output at the load end of the wires, such as by contacting the ends of the wires or shorting the ends with a conductor. At this point, the user may provide input to a power supply (e.g., via a front panel or other interface) to calibrate the wire resistance. During this time, the power supply may obtain or calculate the wire resistance. With this done, the user may remove the short from the load (or at the end of the wires) and the power supply will automatically compensate for any load variation. Because there are no sense wires, there is no possibility of picking up noise from sense wires. There is also no possible ground loop. Furthermore, there may be limit to the amount of load wire compensation voltage as there are no sense resistors that can be damaged.

Embodiments disclosed herein may remove any need to add extra wires for wire remote sense and may remove the risk of injected noise or ground loops. Very accurate, very fast regulation can be had at the load with no wires and a simple one-time setup.

A detailed description of systems and methods consistent with embodiments of the present disclosure is provided below. While several embodiments are described, it should be understood that this disclosure is not limited to any one embodiment, but instead encompasses numerous alternatives, modifications, and equivalents. In addition, while numerous specific details are set forth in the following description to provide a thorough understanding of the embodiments disclosed herein, some embodiments may be practiced without some or all of these details. Moreover, for the purpose of clarity, certain technical material that is known in the related art has not been described in detail to avoid unnecessarily obscuring the disclosure.

Figure 3:
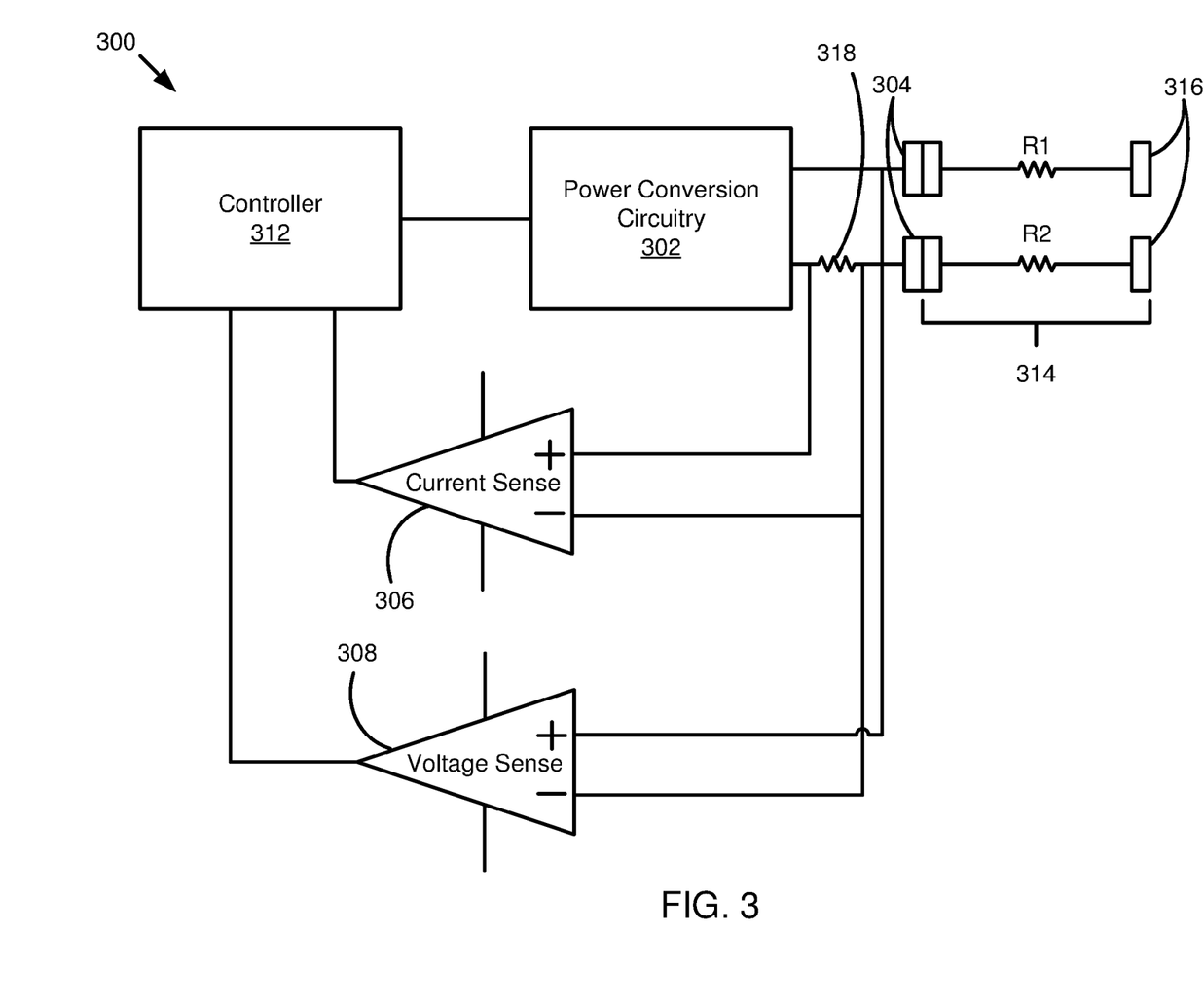
FIG. 3 is a schematic diagram illustrating a power supply for providing wireless remote sense, according to one embodiment.

FIG. 3 is a schematic diagram illustrating a power supply system 300 that provides wireless remote sense. The system 300 includes power conversion circuitry 302 for converting input power (not shown) to output power at output terminals 304. The system 300 includes a current sense amplifier 306 for sensing a current across a current sense resistor 318 and a voltage sense amplifier 308 for sensing a voltage provided by the power conversion circuitry 302. The system 300 also includes a controller 312 that controls output of the power conversion circuitry 302. Wires 314 that are/will be used to provide power to a load are shown connected to the output terminals 304. For example, a load may be connected to wire connectors 316 at the distal ends of the wires 314. R1 and R2 represent the resistance of the wires 314. Because the wires 314 may be long in a test or bench power supply, R1 and R2 may be large enough that they cannot be ignored.

In one embodiment, the controller 312 may control the power supply system 300 to operate in a plurality of different modes. One mode may be a calibration mode. The calibration mode may be used to calibrate the power supply system 300 to compensate for the resistance of the wires 314. In one embodiment, a user interface of the power supply system 300 may include a button to enter the calibration mode. For example, the user may short the wires 314 at the wire connectors 316 and then select the button. With the wire connectors 316 shorted, the controller 312 may cause the power conversion circuitry 302 to provide a current to the wires 314. The current may be a predetermined known current or a current measured using the current sense resistor 318 and the current sense amplifier 306. The controller 312 may then measure the voltage across the output terminals 304 using the voltage sense amplifier 308. The measured voltage and the known current may be used to determine a total wire resistance (e.g., R1+R2) across the wires 314. For example, Ohms law may be used to solve for R1+R2 using Equation 1 below.

$$R_{wires} = \frac{V_{measured}}{I_{provided}} \quad \text{Equation 1}$$

In Equation 1, the wire resistance $R_{wires}$ may represent the total resistance of the wires 314 (e.g., R1+R2). $I_{provided}$ may represent the current across the wires 314 that are shorted at the wire connectors 316. And $V_{measured}$ may represent the voltage measured/sensed by the voltage sense amplifier 308. The wire resistance may then be stored by the controller 312 for use during an operational mode.

In the operational mode, the short between the wire connectors 316 may be removed and the controller 312 may perform calculations and control the power conversion circuitry 302 to provide a desired voltage level to a load. For example, with the resistance of the wires 314 known and stored ($R_{wires}$), the power supply system 300 can accurately provide a desired voltage level at the load (e.g., at the wire connectors 316). In one embodiment, the controller 312 may calculate an output voltage that will provide a desired voltage at the distal end of the wires (at wire connectors 316) to a load using Equation 2 below.

$$V_{out} = V_{load} + I_{out} \times R_{wires} \quad \text{Equation 2:}$$

In Equation 2, $V_{load}$ represents the desired voltage level at the load. For example, $V_{load}$ may be the voltage level entered by a user on a user interface of the power supply system 300. $V_{out}$ represents the output voltage of the power supply system 300 at the output terminals 304. $I_{out}$ represents the current at a specific point in time measured/sensed by the current sense amplifier 306. $R_{wires}$ represents the resistance of the wires 314 that was stored and/or determined during a calibration mode, and which can be retrieved from memory or storage at any time.

Thus, with the calibration mode and operational mode, the power supply system 300 is able to provide a desired voltage to a load. In one embodiment, no wires connected to the wire connectors 316 or near a load are needed as the controller 312 can be calculated the needed voltage based on the measured current and the stored resistance vales of the wires 314. Effectively, remote sense functionality is provided without these wires. The elimination of remote sense wires reduces the problems of injected noise or ground loops. Additionally, because the output may be calculated by the controller 312, real time control of the output can be obtained with little delay. For example, the controller 312 may calculate and recalculate the $V_{out}$ value at the switching frequency of the power conversion circuitry 302. This "digital control" of the output using the controller 312 can therefore lead to extremely accurate and consistent load voltage being provided to a load, even with long connecting wires.

Figure 4:
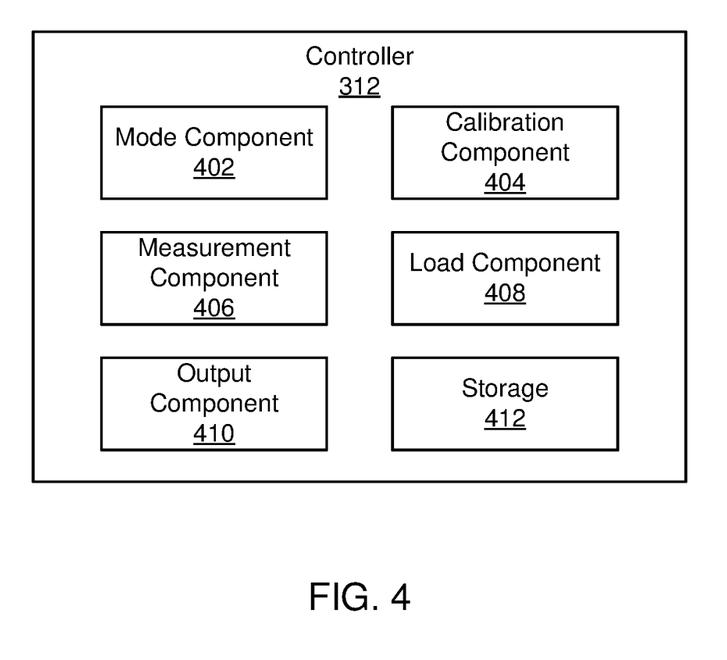
FIG. 4 is a schematic block diagram illustrating components of a controller, according to one embodiment.

FIG. 4 is a schematic block diagram illustrating components of a controller 312. In one embodiment, the controller 312 may include a microcontroller, processor, computer on a chip, or other computing device, processing device, or circuitry to provide both the calibration mode and operational mode. In one embodiment, the controller 312 allows for full digital control of the power supply system as well as wireless remote sense. Although the voltage at the load is not directly sensed, it can be accurately computed based on the known wire or cable resistance obtained during the calibration mode.

The controller 312 includes a plurality of components, which may include circuitry, computer readable memory, or the like for providing control of a power supply system. The controller 312 includes a mode component 402, a calibration component 404, a measurement component 406, a load component 408, an output component 410, and storage 412. The components 402-412 are given by way of example only and may not all be included in all embodiments. Each of the components 402-412 may be included in or may be implemented by the controller 312 or part of a separate device, component, or system.

The mode component 402 is configured to control a current mode or operational state of the controller 312 or a parent power supply system. In one embodiment, the mode component 402 determines a current mode from a plurality of different available modes. In one embodiment, the plurality of different modes includes a calibration mode and an operational mode. In the calibration mode, the controller 312 may determine a resistance of wire leads that are or will be used to provide power to a load. The mode component 402 may cause the controller 312 to enter the calibration mode in response to receiving a signal to trigger calibration from a user. For example, a user may short the distal ends of load wires and then select a user interface option to calibrate a power supply. The interface may provide a signal to the controller 312 or mode component 402 to indicate that the calibration mode was triggered by the user. The calibration mode may determine the resistance of the leads or wires that are used to provide power to a load. This allows operation similar to remote sense without requiring remote sense wires and their associated challenges and disadvantages.

In one embodiment, the mode component 402 may default to an operational mode in which a power supply outputs a selected voltage or power level. For example, a user may be able to provide a desired voltage level via an interface of a power supply. In the operational mode, the controller 312 may attempt to provide that desired voltage level or power level to a load. In one embodiment, the mode component 402 may cause the controller 312 to enter an operational mode a predefined time after a calibration mode has been triggered. In one embodiment, the mode component 402 may cause the controller 312 to exit a calibration mode after it senses a significant change in impedance, which may reflect the removal of a short across the distal ends of leads or wires used to provide power to a load.

The calibration component 404 is configured to calibrate operation of the controller 312 and/or a power supply. The calibration component 404 may perform a calibration process to obtain or determine a resistance of the lead wires that will be/are used to provide power to a load. In the calibration mode, the calibration component 404 may cause the controller to provide the known current while distal ends of the lead wires are shorted, measure the voltage drop at the output of the power supply, and store the resistance or voltage drop for later retrieval. For example, the calibration component 404 may cause the controller 312, using power conversion circuitry to provide a known current when the one or more leads are shorted at the distal end and then measure the voltage drop. The current may be known due to measuring or due to the power supply being designed to accurately provide a specific known current.

The voltage drop, in combination with the known current, may then be used to calculate the resistance of the lead wires using Ohms law. For example, the resistance of the wires will equal the voltage drop divided by the current (see Equation 1). This resistance, or some other value, may be stored as a parameter by the controller 312. For example, the controller 312 may include one or more registers or other computer readable medium where the voltage drop, current level, and/or resistance from the calibration process may be stored for later retrieval. The voltage drop, resistance, or other parameter may be stored in the storage 412.

The measurement component 406 is configured to obtain a measurement of the current, voltage, or other parameter. In one embodiment, the measurement component 406 is configured to obtain a voltage measurement using a voltage sense amplifier (such as the voltage sense amplifier 308 of FIG. 3). The voltage measurement may include the voltage at or near the output terminals of a power supply system. In one embodiment, the measurement component 406 is configured to obtain a current measurement using a current sense amplifier (such as the current sense amplifier 306 of FIG. 3). The current measurement may indicate an amount of current provided through the output terminals of a power supply. The measurement component 406 may perform measurements during a calibration mode, operational mode, or any other mode.

The load component 408 is configured to determine a voltage, current, and/or power level to be provided to a load. In one embodiment, the controller 312 receives an indication of a selected voltage level to be provided to a load. For example, a power supply may include a digital front panel into which a user may provide input to select the voltage level that should be provided to a load. The voltage level provided by the user may then be the target voltage level that the power supply attempts to provide to the load. The load component 408 and/or the front panel, may allow for digital control of a voltage to be provided to the load. In combination with the output component, which may provide digital control of the output of a power supply, full digital control may be available for providing power to a load.

The output component 410 is configured to provide power to a load via output terminals of a power supply. In one embodiment, the output component 410 controls output of the power supply during an operational mode. The output component 410 may provide power output to meet the target voltage, current, or power level obtained or determined by the load component 408.

In one embodiment, the output component 410 calculates an output voltage needed to provide a target voltage at a load. As discussed previously, lead wires used to provide power to a load may cause a voltage drop so that the load receives a different voltage than the output terminals of a power supply. The output component 410 may calculate the needed output based on a parameter, such as a resistance of the lead wires, obtained and stored in storage the 412 during a calibration mode. In one embodiment, the output component calculates the output voltage by summing the target voltage level and a product of the output current and the impedance of the one or more leads. For example, the output component 410 may perform the calculation of Equation 2 (above) to calculate an output voltage for the power conversion circuitry so that the target voltage is present at the load.

Because the resistance of the wires is stored, the output component 410 may calculate the output voltage as frequently as desired to provide extremely accurate and high bandwidth voltage compensation. For example, the output component 410 may calculate the output voltage at the switching frequency of the power conversion circuitry. This can allow for significantly faster and more accurate reactions and consistent voltages at the load over analog voltage controls. Additionally, problems with ground loops and noise are eliminated since no wires are used to determine the voltage at the load.

The storage 412 may include internal flash memory or other computer readable memory within the controller 312. Use of internal memory within the controller 312 may allow for a simple and inexpensive implementation of wireless remote sense because a single chip microcontroller may be used.

Figure 5:
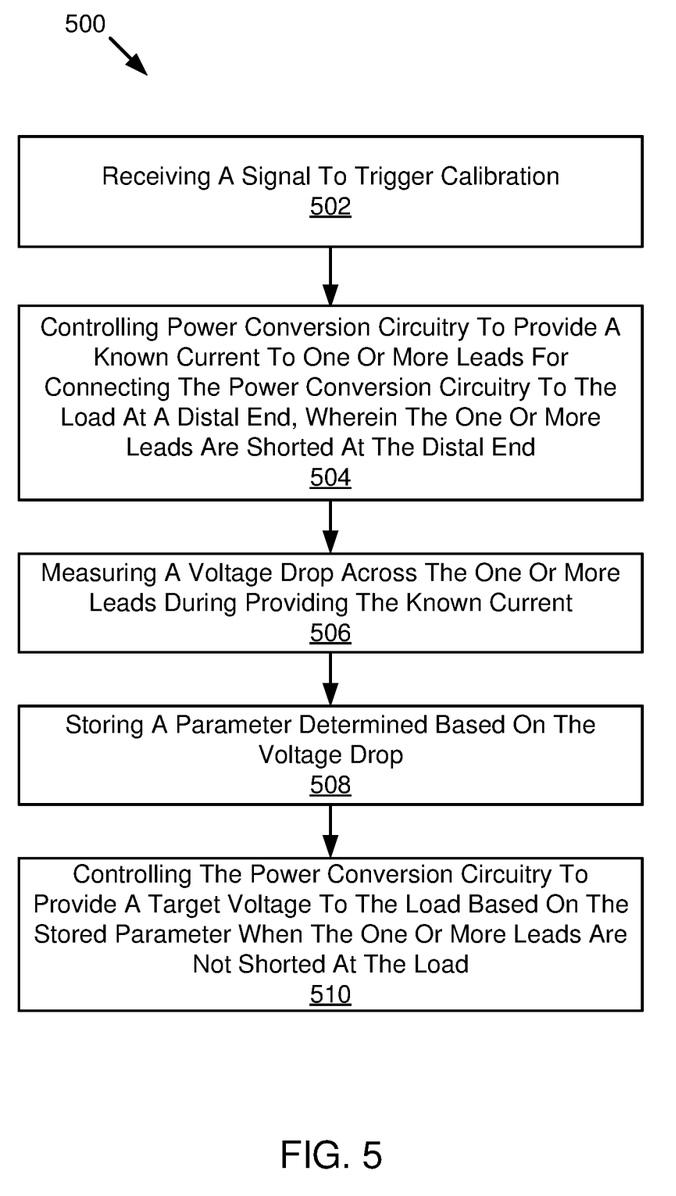
FIG. 5 is a schematic flow chart diagram illustrating a method for providing power to a load, according to one embodiment.

FIG. 5 is a schematic flow chart diagram illustrating an example method 500 for power supply control. The method 500 may be performed by a power supply or controller of a power supply, such as the controller 312 of FIG. 3 or 4 or the power supply of FIG. 3.

The method 500 begins and a mode component 402 receives a signal to trigger calibration at 502. The mode component 402 may place the power supply in a calibration mode in response to the signal. A calibration component 404 controls at 504 the power conversion circuitry to provide a known current to one or more leads for connecting the power conversion circuitry to the load at a distal end. The one or more leads are shorted at the distal end during application of the known current. A measurement component 406 measures at 506 a voltage drop across the one or more leads shorted at the distal end. The calibration component 404 stores at 508 a parameter determined based on the voltage drop. The parameter may be stored in a register or memory of a controller or microcontroller. The parameter may include one or more of the voltage drop or an impedance of the one or more leads calculated based on the voltage drop and the known current. An output component 510 controls at 510 the power conversion circuitry to provide a target voltage to the load based on the stored parameter when the one or more leads are not shorted at the load. For example, applying a calculated output voltage to a load may result in the target voltage resulting at the load.

Figure 6:
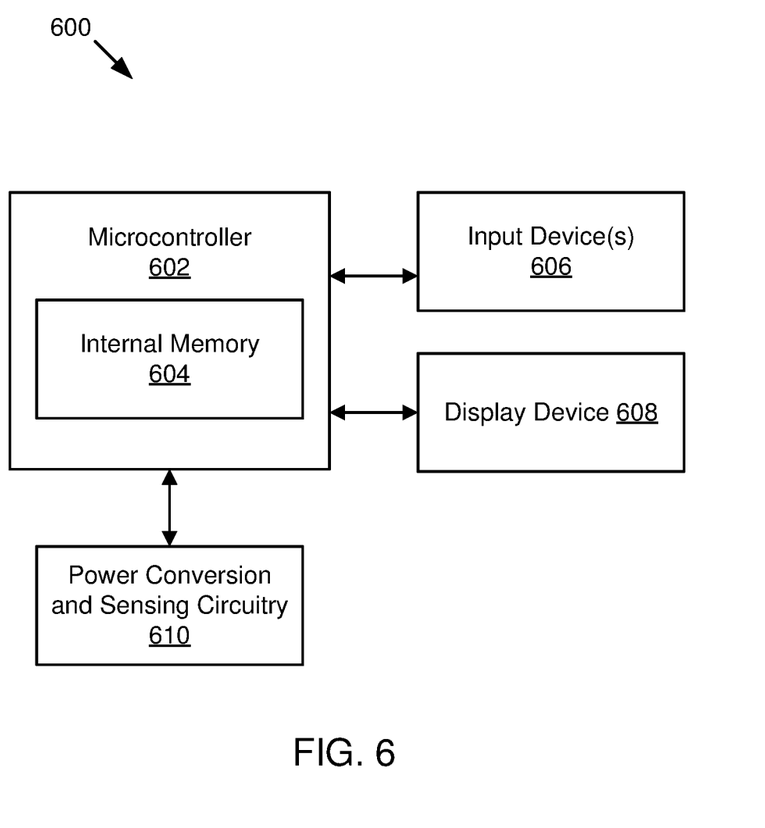
FIG. 6 is a schematic block diagram illustrating a power supply system, according to one implementation.

Referring now to FIG. 6, a block diagram of an example digitally controller power supply system 600 is illustrated. The system 600 may be used to implement the embodiments of FIGS. 3, 4, and 5. The system 600 includes a microcontroller with internal memory 604. The microcontroller 602 may be used as the controller 312 in FIG. 3 or 4. The internal memory 604 may include internal flash memory within the microcontroller 602. In one embodiment, a resistance value that is calculated during calibration is stored in the internal memory 604. The presence of internal memory 602 may simply and reduce a cost of the system because expensive external memory or storage may not be needed.

The system 600 includes input devices 606 and display devices 608. In one embodiment, the input devices 606 include a push button and two rotary encoders. The push button may be used to select a mode of the microcontroller 602 and system 600, such as selecting a calibration mode. The rotary encoders may allow for the selection of voltage, current, or other output levels or parameters of the system 600. The display devices 608 may include a small character display that shows a currently selected mode, voltage, or parameter. The display devices 608 may display a visual interface to allow a user to control and provide input using the input devices 606.

The system 600 also includes power conversion and sensing circuitry 610. The power conversion circuitry may convert in put power (e.g., from a wall, batter, or other power source) to output power. The output power of the power conversion circuitry may be controlled by the microcontroller 602 to match the input values provided by a user using the input devices 606 and the display devices 608. The sensing circuitry may measure output parameters for the power conversion circuitry and provide sensed values to the microcontroller 602 for digital feedback control of the output of the power conversion circuitry.

EXAMPLES

The following examples pertain to further embodiments.

Example 1 is a system that includes power conversion circuitry for providing electrical power to a load. The system includes output terminals, which output power from the power conversion circuitry. The system includes a controller for controlling output of electrical power from the power conversion circuitry. The controller is configured to receive a signal to trigger calibration. The controller is configured to control the power conversion circuitry to provide a known current to one or more leads for connecting the power conversion circuitry to the load at a distal end, wherein the one or more leads are shorted at the distal end. The controller is configured to measure a voltage drop across the one or more leads shorted at the distal end. The controller is configured to store a parameter determined based on the voltage drop, wherein the parameter includes one or more of the voltage drop and an impedance of the one or more leads calculated based on the voltage drop and the known current. The controller is configured to control the power conversion circuitry to provide a target voltage to the load based on the stored parameter when the one or more leads are not shorted at the load.

In Example 2, the controller of Example 1 is further configured to receive an indication of the target voltage level for the load and calculate an output voltage for the power conversion circuitry to provide the target voltage level to the load.

In Example 3, the controller of Example 2 measures an output current provided by the power conversion circuitry, and wherein the controller calculates the output voltage by summing the target voltage level and a product of the output current and the impedance of the one or more leads.

In Example 4, the controller as in any of Examples 2-3 calculates the output voltage at the switching frequency of the power conversion circuitry.

In Example 5, the system as in any of Examples 1-4 does not include remote sense leads connected to distal ends of the one or more leads.

In Example 6, the controller in any of Examples 1-5 enters a calibration mode in response to receiving the signal to trigger calibration.

In Example 7, the controller of Example 6 is configured to control the power conversion circuitry to provide the known current, measure the voltage drop, and store the parameter during the calibration mode. The controller is configured to control the power conversion circuitry to provide the target voltage during an operation mode.

In Example 8, the controller as in any of Examples 1-7 provides digital control of the output of the power conversion circuitry.

Example 9 is a method for controlling power output of a power supply. The method includes, during a calibration mode, controlling the power conversion circuitry to provide a known current to one or more leads for connecting the power conversion circuitry to a load at a distal end, wherein the one or more leads are shorted at the distal end. The method includes, during the calibration mode, measuring a voltage drop across the one or more leads shorted at the distal end. The method includes, during the calibration mode, storing a parameter determined from the voltage drop, wherein the parameter includes one or more of the voltage drop and an impedance of the one or more leads calculated based on the voltage drop and the known current. The method includes, during an operational mode, controlling the power conversion circuitry to provide a target voltage to the load based on the stored parameter when the one or more leads are not shorted at the load.

In Example 10, the method of Example 9 further includes, during operational mode, receiving an indication of the target voltage level for the load and calculating an output voltage for the power conversion circuitry to provide the target voltage level to the load.

In Example 11, the method of Example 10 further includes measuring an output current provided by the power conversion circuitry, wherein calculating the output voltage includes calculating the output voltage by summing the target voltage level a product of the output current and the impedance of the one or more leads.

In Example 12, the calculating the output voltage as in any of Examples 10-11 includes calculating the output voltage at the switching frequency of the power conversion circuitry.

In Example 13, controlling the power conversion circuitry to provide the target voltage to the load as in any of Examples 9-12 further includes controlling without measuring voltage at or near the load using remote sense leads connected to distal ends of the one or more leads.

In Example 14, the method as in any of Examples 9-14 further includes entering the calibration mode in response to receiving a signal to trigger calibration.

Example 15 is non-transitory computer readable storage media storing instructions that, when executed by one or more processors, cause the one or more processors to receive a signal to trigger remote sense calibration. The instructions cause the one or more processors to control the power conversion circuitry to provide a known current to one or more leads for connecting the power conversion circuitry to a load at a distal end, wherein the one or more leads are shorted at the distal end. The instructions cause the one or more processors to measure a voltage drop across the one or more leads shorted at the distal end. The instructions cause the one or more processors to store a parameter determined from the voltage drop, wherein the parameter includes one or more of the voltage drop or an impedance of the one or more leads calculated based on the voltage drop and the known current. The instructions cause the one or more processors to control the power conversion circuitry to provide a target voltage to the load based on the stored parameter when the one or more leads are not shorted at the load.

In Example 16, the instructions cause the one or more processors of Example 15 receive an indication of the target voltage level for the load and calculate an output voltage for the power conversion circuitry to provide the target voltage level to the load.

In Example 17, the instructions cause the one or more processors of Example 16 measure an output current provided by the power conversion circuitry, wherein calculating the output voltage includes calculating the output voltage by summing the target voltage level and a product of the output current and the impedance of the one or more leads.

In Example 18, the instructions as in any of Examples 16-17 to calculate the output voltage by calculating the output voltage at the switching frequency of the power conversion circuitry.

In Example 19, the instructions as in any of Examples 15-18 cause the one or more processors to control the power conversion circuitry to provide the target voltage to the load without measuring voltage at or near the load using remote sense leads connected to distal ends of the one or more leads.

In Example 20, the instructions as in any of Examples 16-19 cause the one or more processors to control the power conversion circuitry to provide the known current, measure the voltage drop, and store the parameter during a calibration mode, and to control the power conversion circuitry to provide the target voltage during an operation mode.

Example 21 is an apparatus including means to perform a method or realize a system or apparatus as in any of Examples 1-20.

Various techniques, or certain aspects or portions thereof, may take the form of program code (i.e., instructions) embodied in tangible media, such as floppy diskettes, CD-ROMs, hard drives, a non-transitory computer readable storage medium, or any other machine readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, an EPROM, a flash drive, an optical drive, a magnetic hard drive, or another medium for storing electronic data. One or more programs that may implement or utilize the various techniques described herein may use an application programming interface (API), reusable controls, and the like. Such programs may be implemented in a high-level procedural or an object-oriented programming language to communicate with a computer system. However, the program(s) may be implemented in assembly or machine language, if desired. In any case, the language may be a compiled or interpreted language, and combined with hardware implementations.

It should be understood that many of the functional units described in this specification may be implemented as one or more components, which is a term used to more particularly emphasize their implementation independence. For example, a component may be implemented as a hardware circuit comprising custom very large scale integration (VLSI) circuits or gate arrays, off-the-shelf semiconductors such as logic chips, transistors, or other discrete components. A component may also be implemented in programmable hardware devices such as field programmable gate arrays, programmable array logic, programmable logic devices, or the like.

Components may also be implemented in software for execution by various types of processors. An identified component of executable code may, for instance, comprise one or more physical or logical blocks of computer instructions, which may, for instance, be organized as an object, a procedure, or a function. Nevertheless, the executables of an identified component need not be physically located together, but may comprise disparate instructions stored in different locations that, when joined logically together, comprise the component and achieve the stated purpose for the component.

Indeed, a component of executable code may be a single instruction, or many instructions, and may even be distributed over several different code segments, among different programs, and across several memory devices. Similarly, operational data may be identified and illustrated herein within components, and may be embodied in any suitable form and organized within any suitable type of data structure. The operational data may be collected as a single data set, or may be distributed over different locations including over different storage devices, and may exist, at least partially, merely as electronic signals on a system or network. The components may be passive or active, including agents operable to perform desired functions.

Reference throughout this specification to "an example" means that a particular feature, structure, or characteristic described in connection with the example is included in at least one embodiment of the present disclosure. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples of the present disclosure may be referred to herein along with alternatives for the various components thereof. It is understood that such embodiments, examples, and alternatives are not to be construed as de facto equivalents of one another, but are to be considered as separate and autonomous representations of the present disclosure.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive.

Those having skill in the art will appreciate that many changes may be made to the details of the above-described embodiments without departing from the underlying principles of the disclosure. The scope of the present disclosure should, therefore, be determined only by the following claims.

What is claimed is:

1. A system comprising:
   power conversion circuitry for providing electrical power to a load;
   output terminals that output power from the power conversion circuitry;
   a controller for controlling output of electrical power from the power conversion circuitry, wherein the controller is configured to:
      receive a signal to trigger calibration;
      control the power conversion circuitry to provide a known current to one or more leads for connecting the power conversion circuitry to the load at a distal end, wherein the one or more leads are shorted at the distal end;
      measure a voltage drop across the one or more leads shorted at the distal end;
      store a parameter determined based on the voltage drop, wherein the parameter comprises one or more of the voltage drop and an impedance of the one or more leads calculated based on the voltage drop and the known current; and
      control the power conversion circuitry to provide a target voltage to the load based on the stored parameter when the one or more leads are not shorted at the load.

2. The system of claim 1, wherein the controller is further configured to:
   receive an indication of the target voltage level for the load; and
   calculate an output voltage for the power conversion circuitry to provide the target voltage level to the load.

3. The system of claim 2, wherein the controller measures an output current provided by the power conversion circuitry, and wherein the controller calculates the output voltage by summing:
   the target voltage level; and
   a product of the output current and the impedance of the one or more leads.

4. The system of claim 2, wherein the controller calculates the output voltage at the switching frequency of the power conversion circuitry.

5. The system of claim 1, wherein the system does not comprise remote sense leads connected to distal ends of the one or more leads.

6. The system of claim 1, wherein the controller enters a calibration mode in response to receiving the signal to trigger calibration.

7. The system of claim 6, wherein the controller is configured to control the power conversion circuitry to provide the known current, measure the voltage drop, and store the parameter during the calibration mode; and
wherein the controller is configured to control the power conversion circuitry to provide the target voltage during an operation mode.

8. The system of claim 6, wherein the one or more instructions cause the one or more processors to:
control the power conversion circuitry to provide the known current, measure the voltage drop, and store the parameter during a calibration mode; and
control the power conversion circuitry to provide the target voltage during an operation mode.

9. The system of claim 1, wherein the controller provides digital control of the output of the power conversion circuitry.

10. A method for controlling power output of a power supply, the method comprising:
during a calibration mode:
controlling the power conversion circuitry to provide a known current to one or more leads for connecting the power conversion circuitry to a load at a distal end, wherein the one or more leads are shorted at the distal end;
measuring a voltage drop across the one or more leads shorted at the distal end;
storing a parameter determined from the voltage drop, wherein the parameter comprises one or more of the voltage drop and an impedance of the one or more leads calculated based on the voltage drop and the known current; and
during an operation mode, controlling the power conversion circuitry to provide a target voltage to the load based on the stored parameter when the one or more leads are not shorted at the load.

11. The method of claim 10, further comprising, during the operation mode:
receiving an indication of the target voltage level for the load; and
calculating an output voltage for the power conversion circuitry to provide the target voltage level to the load.

12. The method of claim 11, further comprising measuring an output current provided by the power conversion circuitry, and wherein calculating the output voltage comprises calculating the output voltage by summing:
the target voltage level; and
a product of the output current and the impedance of the one or more leads.

13. The method of claim 11, wherein calculating the output voltage comprises calculating the output voltage at the switching frequency of the power conversion circuitry.

14. The method of claim 10, wherein controlling the power conversion circuitry to provide the target voltage to the load comprises controlling without measuring voltage at or near the load using remote sense leads connected to distal ends of the one or more leads.

15. The method of claim 10, further comprising entering the calibration mode in response to receiving a signal to trigger calibration.

16. Non-transitory computer readable storage media storing instructions that, when executed by one or more processors, cause the one or more processors to:
receive a signal to trigger remote sense calibration;
control the power conversion circuitry to provide a known current to one or more leads for connecting the power conversion circuitry to a load at a distal end, wherein the one or more leads are shorted at the distal end;
measure a voltage drop across the one or more leads shorted at the distal end;
store a parameter determined from the voltage drop, wherein the parameter comprises one or more of the voltage drop and an impedance of the one or more leads calculated based on the voltage drop and the known current; and
control the power conversion circuitry to provide a target voltage to the load based on the stored parameter when the one or more leads are not shorted at the load.

17. The computer readable storage media of claim 16, wherein the one or more instructions further cause the one or more processors to:
receive an indication of the target voltage level for the load; and
calculating an output voltage for the power conversion circuitry to provide the target voltage level to the load.

18. The computer readable storage media of claim 17, wherein the one or more instructions further cause the one or more processors to:
measuring an output current provided by the power conversion circuitry;
wherein calculating the output voltage comprises calculating the output voltage by summing the target voltage level and a product of the output current and the impedance of the one or more leads.

19. The computer readable storage media of claim 17, wherein the one or more instructions cause the one or more processors to calculate the output voltage by calculating the output voltage at the switching frequency of the power conversion circuitry.

20. The computer readable storage media of claim 16, wherein the one or more instructions cause the one or more processors to control the power conversion circuitry to provide the target voltage to the load without measuring voltage at or near the load using remote sense leads connected to distal ends of the one or more leads.

* * * * *